United States Patent
Gasse et al.

(10) Patent No.: US 10,115,864 B2
(45) Date of Patent: Oct. 30, 2018

(54) OPTOELECTRONIC DEVICE WITH LIGHT-EMITTING DIODES AND AN IMPROVED RADIATION PATTERN

(71) Applicants: Commissariat à l'Énergie Atomique et aux Énergies Alternatives, Paris (FR); Aledia, Grenoble (FR)

(72) Inventors: Adrien Gasse, Seyssins (FR); Bernard Andre, Quaix en Chartreuse (FR); Hubert Bono, Grenoble (FR); Xavier Hugon, Teche/Vinay (FR)

(73) Assignees: Commissariat à l'Éneergie Atomique et aux Énergies Alternatives, Paris (FR); Aledia, Grenoble (FR)

( * ) Notice: Subject to any disclaimer, the term of this patent is extended or adjusted under 35 U.S.C. 154(b) by 0 days.

(21) Appl. No.: 15/302,478

(22) PCT Filed: Mar. 27, 2015

(86) PCT No.: PCT/FR2015/050810
§ 371 (c)(1),
(2) Date: Oct. 6, 2016

(87) PCT Pub. No.: WO2015/155437
PCT Pub. Date: Oct. 15, 2015

(65) Prior Publication Data
US 2017/0033264 A1 Feb. 2, 2017

(30) Foreign Application Priority Data
Apr. 9, 2014 (FR) ...................................... 14 53148

(51) Int. Cl.
*H01L 33/00* (2010.01)
*H01L 33/50* (2010.01)
(Continued)

(52) U.S. Cl.
CPC .............. *H01L 33/32* (2013.01); *H01L 27/15* (2013.01); *H01L 33/0075* (2013.01);
(Continued)

(58) Field of Classification Search
CPC ......... H01L 33/08; H01L 33/18; H01L 33/20; H01L 33/24; H01L 33/32; H01L 33/0075; H01L 33/0079; H01L 27/15
(Continued)

(56) References Cited

U.S. PATENT DOCUMENTS 8,253,161 B2  8/2012  Kim
2007/0195524 A1  8/2007  Seo et al.
(Continued)

FOREIGN PATENT DOCUMENTS

CN  203028972 U  7/2013
EP  1847759 A2  10/2007
(Continued)

OTHER PUBLICATIONS

International Search Report, dated Jun. 25, 2015, from corresponding International Application No. PCT/FR2015/050810.
(Continued)

*Primary Examiner* — Dao H Nguyen
(74) *Attorney, Agent, or Firm* — Wolf, Greenfield & Sacks, P.C.

(57) ABSTRACT

An optoelectronic device provided with a support including a face having at least one concave or convex portion, the amplitude of the sagitta of said portion being higher than $\frac{1}{20}$th of the chord of the portion, and light-emitting diodes arranged on the portion, each light-emitting diode including a cylindrical, conical or frustoconical semiconductor element in contact with the portion, the amplitude of the sagitta of the contact surface between each semiconductor element and the portion being lower than or equal to 0.5 um.

15 Claims, 5 Drawing Sheets

(51) Int. Cl.
   H01L 33/32  (2010.01)
   H01L 27/15  (2006.01)
   H01L 33/18  (2010.01)
   H01L 33/20  (2010.01)
   H01L 33/24  (2010.01)
   H01L 33/08  (2010.01)

(52) U.S. Cl.
   CPC .......... H01L 33/0079 (2013.01); H01L 33/18 (2013.01); H01L 33/20 (2013.01); H01L 33/24 (2013.01); H01L 33/08 (2013.01); *H01L 2224/48091* (2013.01); *H01L 2224/48227* (2013.01); *H01L 2224/73265* (2013.01)

(58) Field of Classification Search
   USPC ....... 257/76, 98, 99, 103, E33.058, E33.059, 257/E33.068, E33.072; 362/235, 543; 438/22, 29
   See application file for complete search history.

(56) References Cited

U.S. PATENT DOCUMENTS

| | | | | |
|---|---|---|---|---|
| 2008/0290357 A1* | 11/2008 | Lin | ..................... | H01L 25/0753 257/98 |
| 2010/0252843 A1* | 10/2010 | Ohashi | .................. | H01L 33/483 257/91 |
| 2011/0177635 A1* | 7/2011 | Mitsuishi | .................. | F21K 9/00 438/27 |
| 2012/0312988 A1* | 12/2012 | Mataga | ..................... | G01J 5/10 250/338.3 |
| 2017/0205561 A1* | 7/2017 | Thompson | ........... | G02B 6/0045 |

FOREIGN PATENT DOCUMENTS

EP          2337099 A2     6/2011
WO    WO 2013/080174 A1  6/2013

OTHER PUBLICATIONS

Written Opinion, dated Jun. 25, 2015, from corresponding International Application No. PCT/FR2015/050810.

* cited by examiner

OPTOELECTRONIC DEVICE WITH LIGHT-EMITTING DIODES AND AN IMPROVED RADIATION PATTERN

CROSS-REFERENCE TO RELATED APPLICATIONS

This application is the national phase of International Application No. PCT/FR2015/050810, filed on Mar. 27, 2015, which claims priority to French patent application 14/53148, filed on Apr. 9, 2014, both of which applications are hereby incorporated by reference to the maximum extent allowable by law.

BACKGROUND

The present invention generally relates to optoelectronic devices based on semiconductor materials and to methods for manufacturing the same. The present invention more specifically relates to optoelectronic devices comprising light-emitting diodes.

DISCUSSION OF THE RELATED ART

The emission diagram, also called radiation diagram, of a light-emitting diode, represents the angular distribution of the relative intensity of the light radiation emitted by the light-emitting diode. The emission diagram of a light-emitting diode is generally imposed by the structure of the light-emitting diode.

It is known to form a light-emitting diode comprising a stack of layers formed on a planar support. The relative intensity of the emission diagram of such a light-emitting diode is generally maximum along a reference direction which corresponds to the direction perpendicular to the surface of the support having the light-emitting diode formed thereon and decreases with the inclination of the emission direction relative to the reference direction.

The optoelectronic device comprising a light-emitting diode may then comprise secondary optical systems, in particular lenses or other optical systems, to modify the emission diagram of the light-emitting diode. Indeed, for certain applications, it may be desirable for the relative intensity of the emission diagram to be substantially the same whatever the emission direction. For other applications, it may be desirable for the relative intensity of the emission diagram to strongly decrease as soon as the emission direction is inclined with respect to the reference direction.

A disadvantage of existing optoelectronic devices is that secondary optical systems may be bulky and/or be complex to design to obtain the desired emission diagrams. Further, they are expensive and their efficiency is smaller than 1, which induces a general loss of flow.

Another disadvantage of existing optoelectronic devices is that the use of secondary optical systems makes the optoelectronic device manufacturing method more complex.

SUMMARY

Thus, an object of an embodiment is to overcome at least part of the disadvantages of previously-described optoelectronic devices comprising light-emitting diodes and of methods of manufacturing the same.

Another object of an embodiment is to control the emission diagram of an optoelectronic device comprising light-emitting diodes without using a secondary optical system.

Another object of an embodiment is to decrease the bulk of the optoelectronic device.

Another object of an embodiment is for optoelectronic devices comprising light-emitting diodes to be capable of being manufactured at an industrial scale and at a low cost.

Thus, an embodiment provides an optoelectronic device comprising a support comprising a surface having at least one concave or convex portion, the amplitude of the deflection of said portion being greater than $1/20^{th}$ of the chord of said portion, and light-emitting diodes resting on said portion, each light-emitting diode comprising a cylindrical, conical or tapered semiconductor element in contact with said portion, the amplitude of the deflection of the contact surface between each semiconductor element and said portion being smaller than or equal to 0.5 µm.

According to an embodiment of the present invention, the radius of curvature of said portion is greater than half the chord of said portion.

According to an embodiment of the present invention, the ratio of the contact surface area of each semiconductor element to the surface area of said portion is smaller than 0.7.

According to an embodiment of the present invention, the device comprises at least 4 light-emitting diodes resting on said portion.

According to an embodiment of the present invention, each light-emitting diode comprises an active region capable of emitting a light radiation, where the active region at least partially covers the semiconductor element and is not in contact with said portion.

According to an embodiment of the present invention, each semiconductor element is mainly made of a III-V compound.

According to an embodiment of the present invention, each semiconductor element mainly comprises gallium nitride.

According to an embodiment of the present invention, the support comprises a layer of a metallic, insulating or semiconductor material having a thickness greater than 100 nm, the external surface of said layer forming said portion.

According to an embodiment of the present invention, said layer is made of silicon.

According to an embodiment of the present invention, the average diameter of each semiconductor element is in the range from 5 nm to 2.5 µm.

An embodiment also provides a method of manufacturing an optoelectronic device, comprising the steps of:

(1) forming on a substrate light-emitting diodes, each light-emitting diode comprising a cylindrical, conical or tapered semiconductor element, in contact with the substrate;

(2) thinning the substrate at least at the level of the light-emitting diodes; and (3) deforming the substrate to form at least a concave or convex portion having light-emitting diodes resting thereon, the amplitude of the deflection of said portion being greater than $1/20^{th}$ of the chord of said portion, the amplitude of the deflection of the contact surface between each semiconductor element and said portion being smaller than or equal to 0.5 µm.

According to an embodiment of the present invention, at step (3), the substrate is sandwiched between first and second parts, at least one of the first or second parts comprising a protrusion or a cavity having a shape complementary to said portion.

According to an embodiment of the present invention, said protrusion comprises a deformable material.

According to an embodiment of the present invention, step (2) comprises etching an opening into the substrate on the side opposite to the light-emitting diodes.

According to an embodiment of the present invention, step (2) comprises fastening a handle on the side of the light-emitting diodes and thinning the entire substrate.

BRIEF DESCRIPTION OF THE DRAWINGS

The foregoing and other features and advantages will be discussed in detail in the following non-limiting description of dedicated embodiments in connection with the accompanying drawings, among which.

DETAILED DESCRIPTION

Figure 1:
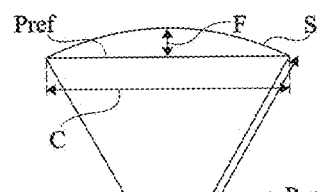
FIG. 1 illustrates parameters used in the present application.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for biasing the light-emitting diodes of an optoelectronic device are well known and will not be described.

In the following description, unless otherwise indicated, terms "substantially", "approximately", and "in the order of" mean "to within 10%". Further, "compound mainly formed of a material" or "compound based on a material" means that a compound comprises a proportion greater than or equal to 95% of said material, this proportion being preferably greater than 99%.

FIG. 1 is a simplified cross-section view of a surface S. In the following description, call deflection F the maximum distance between surface S and a reference plane Pref. In FIG. 1, the edge of surface S rests on reference plane Pref. As a variation, reference plane Pref may be a plane tangent to surface S. Call mean radius of curvature Rm of surface S the radius of curvature equal to the average of the radius of curvature of surface S. In the case where surface S corresponds to a spherical cap, the radius of curvature of surface S is constant and equal to mean radius of curvature Rm. Call O the mean center of curvature associated with a surface having mean radius of curvature Rm and deflection F, and call angle $\alpha$ the angle containing surface S seen from mean center of curvature O. In the case where the edge of surface S rests on reference plane Pref, call chord C of surface S the diameter of the disk having the same area as the planar surface delimited by the contact curve of surface S on reference plane Pref, which corresponds to the mean diameter of the curve of contact of surface S on reference plane Pref, in other words the mean diameter of the border of surface S.

Figure 2:
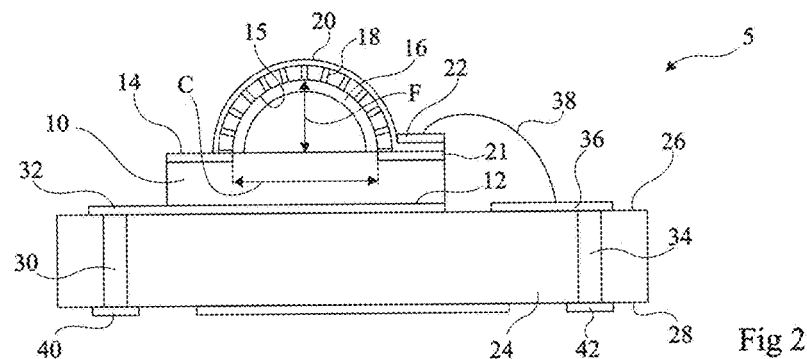
FIG. 2 to 4 are partial simplified cross-section views of embodiments of an optoelectronic device.

FIG. 2 is a partial simplified cross-section view of an embodiment of an optoelectronic device 5 with light-emitting diodes comprising:

a conductive support 10 comprising a planar lower surface 12 and an upper surface 14 comprising a bulged portion 15, also called convex portion hereafter, corresponding to the external surface of a conductive layer 16;

light-emitting diodes 18 distributed on layer 16;

an electrode 20, at least partially transparent, in contact with each light-emitting diode 18 and extending on surface 14, an insulating portion 21 being interposed between electrode 20 and support 10;

a conductive pad 22 in contact with electrode 20;

a base 24 comprising a planar upper surface 26 having support 10 attached thereto and a planar lower surface 28 opposite to upper surface 26;

a via 30 crossing base 24 and connected to rear surface 12 of support 10, for example, a conductive region 32 extending on surface 26 and between support 10 and base 24, via 30 being made of an electrically-conductive material and being insulated from base 24;

a via 34 crossing base 24 and connected to pad 22 of support 10, for example, a conductive region 36 and a conductive wire 38, via 34 being made of an electrically-conductive material and being insulated from base 24;

a contact pad 40 connected to via 30; and a contact pad 42 connected to via 34.

In the embodiment shown in FIG. 2, the biasing of light-emitting diodes 18 is performed by application of a voltage between electrode 20 and lower surface 12 of support 10.

Figure 3:
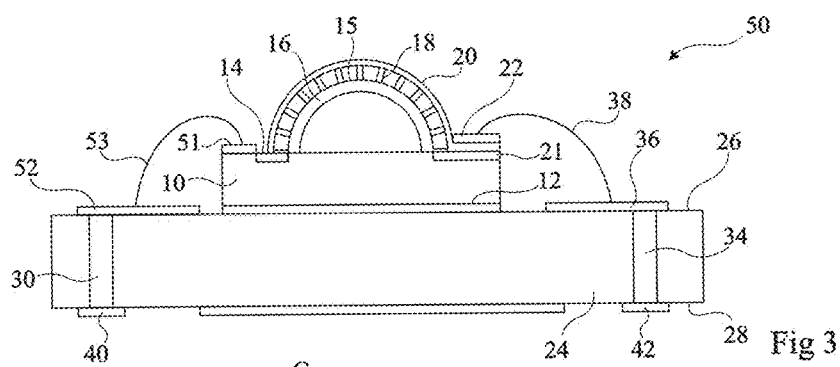

FIG. 3 is a partial simplified cross-section view of another embodiment of an optoelectronic device 50 comprising a conductive pad 51 on surface 14 and a conductive region 52 on surface 26 in contact with via 30 and connected to conductive pad 51 by a conductive wire 53. In the embodiment shown in FIG. 3, the biasing of light-emitting diodes 18 is performed by the application of a voltage between contact pads 22 and 51, which translates, in the same way as for optoelectronic device 5 shown in FIG. 2, as a potential difference between electrode 20 and conductive support 10, more specifically the external surface of layer 16 of support 10.

In FIGS. 2 and 3, the upper contact is provided by transparent electrode 20 via pad 22, insulating portion 21 ensuring the insulation with substrate 10 and layer 16. In FIG. 2, the lower contact is achieved through layer 16 via substrate 10 electrically connected to pad 32 of base 24. In FIG. 3, substrate 10 may be electrically insulating and the contact is still provided through layer 16 but with a contacting area at the front surface on pad 21.

As a variation, layer 16 is non-conductive. In this case, conductive vias crossing layer 16 may be provided to electrically connect diodes 18 and support 10.

Figure 4:
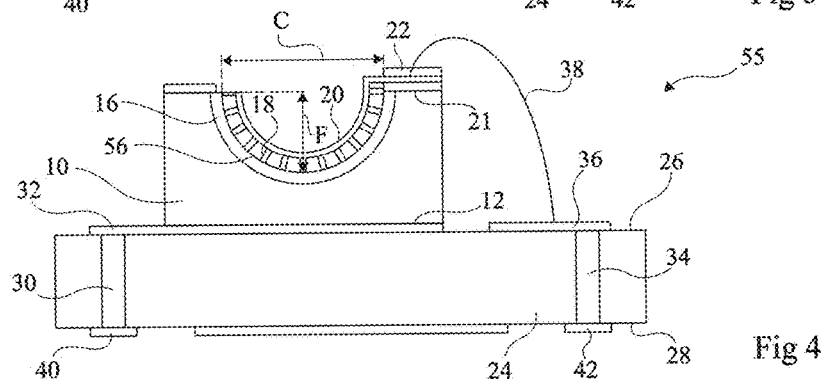

FIG. 4 is a partial simplified cross-section view of another embodiment of an optoelectronic device 55 comprising light-emitting diodes. Optoelectronic device 55 comprises all the elements of device 5 shown in FIG. 2, with the different that bulged portion 15 is replaced with a hollow portion 56, also called concave portion hereafter.

The variation shown in FIG. 3 may also be implemented with the embodiment shown in FIG. 4.

The amplitude of the deflection of convex portion 15 or of concave portion 56 should be sufficient to allow a substantial modification of the emission diagram. Typically, the deflection should be greater than $1/20^{th}$ of chord C of convex or concave portion 15 or 56. For example for a convex or concave portion 15 or 56 having its chord C equal to 1 mm, deflection F is at least 50 µm and for a convex or concave portion 15 or 56 having its chord C equal to 250 µm, deflection F is at least 12.5 µm. Preferably, deflection F is equal to one quarter of chord C of convex or concave portion 15 or 56. To obtain a concave or convex hemispherical shape, deflection F is equal to half of chord C of convex or concave portion 15 or 56. The deflection is measured, for example, with respect to a plane containing all the points of the border of convex portion 15 or of concave portion 56.

The radius of curvature of convex portion 15 or of concave portion 56 is in the range from 0.5 to 3 mm for a convex or concave portion 15 or 56 having a 1-mm chord and an elementary diode thickness in the order of 6 µm and a radius of curvature in the range from 125 to 750 µm for a convex or concave portion 15 or 56 having a 250-µm chord. The radius of curvature of convex portion 15 or of concave portion 56 may not be constant.

In a transverse cross-section plane, considering the mean center of curvature of convex portion 15 or of concave portion 56, the angle containing convex portion 15 or concave portion 56 is greater than 23 degrees, preferably greater than 106 degrees.

In a transverse cross-section plane containing the deflection of convex portion 15 or concave portion 56, the length of the arc formed by convex portion 15 or concave portion 56 is greater than 1.007 mm for a convex portion 15 or a concave portion 56 having a 1-mm chord and 252 µm for a convex portion 15 or a concave portion 56 having a 250-µm chord (case where the deflection is equal to $1/20^{th}$ of the chord), preferably greater than 1.16 mm for a convex portion 15 or a concave portion 56 having a 1-mm chord, and 290 µm for a convex portion 15 or a concave portion 56 having a 250-µm chord (case where the deflection is equal to ¼ of the chord).

Optoelectronic device 5 may comprise from a few light-emitting diodes 18 to several thousands of light-emitting diodes 18, typically from 10,000 to 100,000 diodes per mm2.

The shape of convex portion 15 or of concave portion 56 is selected according to the desired emission diagram of the optoelectronic device. According to an embodiment, convex portion 15 or concave portion 56 corresponds to a hemisphere or to a spherical cap. According to another embodiment, convex portion 15 or concave portion 56 corresponds to a half-cylinder or to a cylinder sector.

In an embodiment, the light-emitting diodes are formed from three-dimensional elements, for example, cylindrical, conical or tapered elements, particularly wire elements, in particular microwires or nanowires. The three-dimensional elements are laid on layer 16, at the level of bulged portion 15 or of concave portion 56 of surface 14.

The active region of each light-emitting diode, which is the region from which most of the electromagnetic radiation supplied by the light-emitting diode is emitted, is formed on the three-dimensional element and is not in contact with layer 16.

The amplitude of the deflection of the contact surface between the three-dimensional element and layer 16 is smaller than 0.5 µm, preferably smaller than 0.1 µm, the 0.5-µm value corresponds to a convex or concave portion 15 or 56 having a 100-µm chord and the 0.1-µm value corresponds to a convex or concave portion 15 or 56 having a 20-µm chord. Due to this condition, the optoelectronic properties, particularly the emission wavelength, of the three-dimensional element (and thus of the elementary diode) are not modified.

Term "microwire" or "nanowire" designates a three-dimensional structure having an elongated shape along a preferred direction, having at least two dimensions, called minor dimensions, in the range from 5 nm to 2.5 µm, preferably from 50 nm to 2.5 µm, the third dimension, called major dimension, being at least equal to 1 time, preferably at least 5 times, and more preferably still at least 10 times, the largest minor dimension. In certain embodiments, the minor dimensions may be smaller than or equal to approximately 1 µm, preferably in the range from 100 nm to 1 µm, more preferably from 100 nm to 800 nm. In certain embodiments, the height of each microwire or nanowire may be greater than or equal to 500 nm, preferably in the range from 1 µm to 50 µm.

In the following description, term "wire" is used to mean "microwire or nanowire". Preferably, the median line of the wire which runs through the centers of gravity of the cross-sections, in planes perpendicular to the preferred direction of the wire, is substantially rectilinear and is called "axis" of the wire hereafter.

Figure 5:
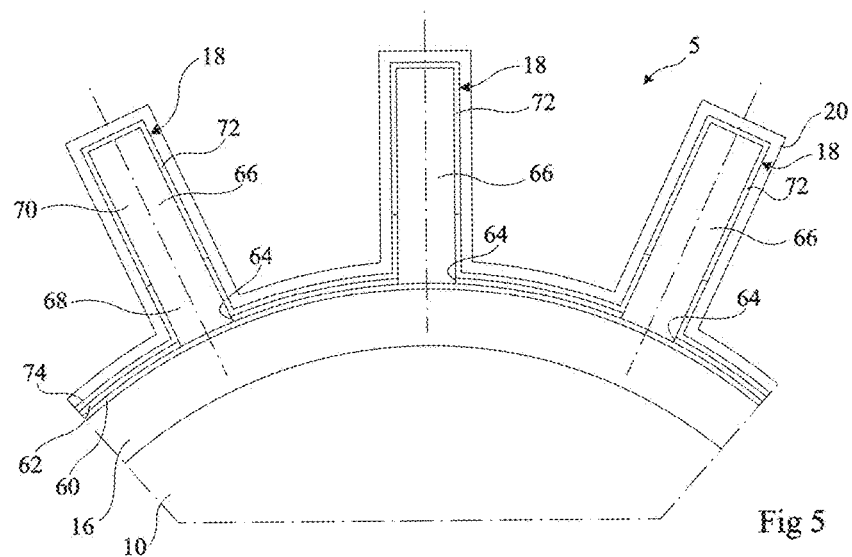
FIGS. 5 and 6 are partial simplified cross-section views of embodiments of the light-emitting diodes of the optoelectronic device of FIG. 2 or 3.

FIG. 5 is a more detailed cross-section view of optoelectronic device 5 and illustrates an embodiment of light-emitting diodes 18, three light-emitting diodes being shown.

In this embodiment, optoelectronic device 5 comprises, from bottom to top:
 a seed layer 60 favoring the growth of wires and arranged on layer 16;
 an insulating layer 62 covering seed layer 60 and comprising openings 64, exposing portions of seed layer 60;
 wires 66 in contact with seed layer 60 through one of openings 64, each wire 20 comprising a lower portion 68, in contact with seed layer 60, and an upper portion 70, continuing lower portion 68;
 a shell 72 comprising a stack of semiconductor layers covering each upper portion 70;
 an insulating layer 74 extending on insulating layer 62 on the lateral sides of lower portion 68 of each wire 66 and, possibly, on a portion of shell 72; and
 a layer 20 forming electrode 20 covering each shell 72 and further extending on insulating layer 74.

Optoelectronic device 5 may further comprise a conductive layer at least partially covering electrode layer 20 between wires 66 but which does not extend on wires 66 and forming pad 22.

Figure 6:
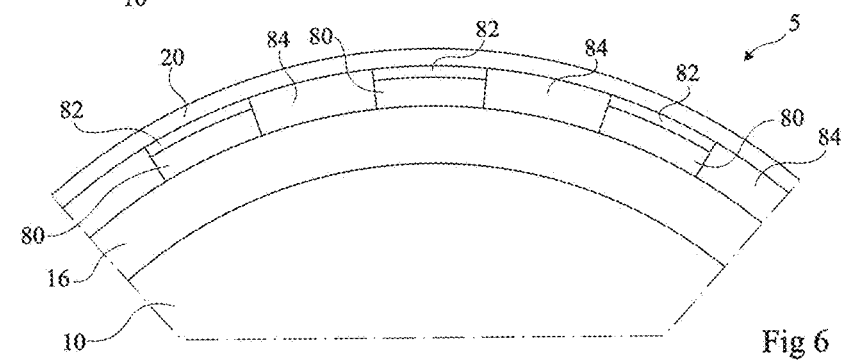

FIG. 6 is a more detailed cross-section view of optoelectronic device 5 and illustrates another embodiment of light-emitting diodes 18, three light-emitting diodes being shown.

In this embodiment, optoelectronic device 5 comprises, from bottom to top:
 cylindrical feet 80 in contact with seed layer 60;
 an active portion 82 at the top of each foot 80;
 insulating portions 84 extending on layer 16 between feet 80; and a layer forming electrode 20 covering each active portion 82 and further extending on insulating portions 84.

Optoelectronic device 5 may further comprise an encapsulation layer covering the entire structure and particularly electrode 20. Optoelectronic device 5 may further comprise a phosphor layer, not shown, provided on the encapsulation layer or confounded therewith. The amplitude of the deflection of layer 16 should be sufficient to allow a substantially modification of the emission diagram. Typically, the deflection should be greater than $1/20^{th}$ of the chord of convex or concave portion 15 or 56. For example, for a convex or concave portion 15 or 56 having a 1-mm chord, the deflection will be at least 50 μm and for a convex or concave portion 15 or 56 having a 250-μm chord, the deflection is at least 12.5 μm and preferably equal to ¼ of the chord of convex or concave portion 15 or 56. To obtain a concave or convex hemispherical shape, the deflection will be equal to half the chord of convex or concave portion 15 or 56. The deflection is for example measured with respect to a plane containing the edge of convex portion 15 or of concave portion 56. Layer 16 is preferably made of a material capable of being resiliently deformed without breaking, with a thickness in the range from 0.1 to 50 μm. The maximum thickness is defined by the tensile strength and is equal, in the case of silicon, to approximately 50 μm.

Layer 16 is preferably made of a semiconductor material, for example, made of silicon, of germanium, of silicon carbide, of a III-V compound, such as GaN or GaAs, or a ZnO substrate. Preferably, layer 16 is made of single-crystal silicon. Preferably, layer 16 is made of a semiconductor material compatible with the manufacturing methods implemented in microelectronics. As a variation, layer 16 may be a metal layer (for example, made of tungsten or of molybdenum).

As a variation, layer 16 may be made of a refractory material (having a melting temperature typically greater than or equal to 1,000° C.) having an elastic limit compatible with the expected deformation.

Layer 16 may be electrically non-conductive, in which case a biasing of diodes 18 is provided via an intermediate conductive layer arranged between layer 16 and diodes 18.

Layer 16 may be made of a material based on silica. Examples of silica-based materials are quartz, molten silica or a silica glass.

Seed layer 60 is made of a material favoring the growth of wires 66. According to another embodiment, seed layer 60 is replaced with seed pads, each wire 66 resting on one of the seed pads. As an example, the material forming seed layer 60 may be a nitride, a carbide, or a boride of a transition metal from column IV, V, or VI of the periodic table of elements or a combination of these compounds. As an example, seed layer 60 may be made of aluminum nitride (AlN), of boron (B), of boron nitride (BN), of titanium (Ti), or titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate (ZrB2), of zirconium nitride (ZrN), of silicon carbide (SiC), of tantalum carbide nitride (TaCN), of magnesium nitride in $Mg_xN_y$ form, where x is approximately equal to 3 and y is approximately equal to 2, for example, magnesium nitride according to form Mg3N2 or magnesium gallium nitride (MgGaN), of tungsten (W), of tungsten nitride (WN), or of a combination thereof.

Insulating layers 62, 74 and insulating portion 84 may be made of a dielectric material, for example, of silicon oxide (SiO2), of silicon nitride ($Si_xN_y$, where x is approximately equal to 3 and y is approximately equal to 4, for example, Si3N4), of silicon oxynitride ($SiO_xN_y$, where x may be approximately equal to ½ and y may be approximately equal to 1, for example, Si2ON2), of aluminum oxide (Al2O3), of hafnium oxide (HfO2), or of diamond. As an example, the thickness of insulating layer 62 and of insulating layer 74 is in the range from 5 nm to 500 nm, for example, equal to approximately 100 nm.

Wires 66 and feet 80 are at least partly formed based on at least one semiconductor material. The semiconductor material may be silicon, germanium, silicon carbide, a III-V compound, a II-VI compound, or a combination of at least two of these compounds.

Wires 66 and feet 80 may be at least partly made of semiconductor materials mainly comprising a III-V compound, for example, a III-N compound. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

Wires 66 and feet 80 may be at least partly formed based on semiconductor materials mainly comprising a II-VI compound. Examples of group-II elements comprise group-IIA elements, particularly beryllium (Be) and magnesium (Mg), and group-IIB elements, particularly zinc (Zn) and cadmium (Cd). Examples of group-VI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions.

Wires 66 and feet 80 may comprise a dopant. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C), or a group-IV N-type dopant, for example, silicon (Si), germanium (Ge), selenium (Se), sulfur (S), terbium (Tb), or tin (Sn).

The cross-section of wires 66 and of feet 80 may have different shapes, such as, for example, oval, circular, or polygonal, particularly triangular, rectangular, square, or hexagonal. It should thus be understood that term "diameter" mentioned in relation with a cross-section of a wire or of a foot designates a quantity associated with the surface area of the targeted structure in this cross-section, corresponding, for example, to the diameter of the disk having the same surface area as the wire cross-section. Preferably, the mean diameter of wire 66 or of foot 80 is in the range from 5 nm to 2.5 μm, preferably from 50 nm to 2.5 μm, more preferably from 200 nm to 1 μm, particularly from 300 nm to 800 nm.

The axes of two adjacent wires 66 or of two adjacent feet 80 may be distant by from 0.5 μm to 10 μm and preferably from 1.5 μm to 4 μm.

Shell 72 or active region 82 may comprise a stack of a plurality of layers, particularly comprising:
an active layer covering the upper portion of wire 66 or of the associated foot 80;
an intermediate layer having a conductivity type opposite the wire or to the foot and covering the active layer; and
a bonding layer covering the intermediate layer and covered with electrode 20.

The active layer is the layer from which most of the radiation delivered by the light-emitting diode is emitted. According to an example, the active layer may comprise confinement means, such as multiple quantum wells. It is for example formed of an alternation of GaN and InGaN layers having respective thicknesses from 5 to 20 nm (for example, 8 nm) and from 1 to 10 nm (for example, 2.5 nm). The GaN layers may be doped, for example, of type N or P. According to another example, the active layer may comprise a single InGaN layer, for example having a thickness greater than 5 nm.

The intermediate layer, for example, P-type doped, may correspond to a semiconductor layer or to a stack of semiconductor layers and allows the forming of a P-N or P-I-N junction, the active layer being comprised between the intermediate P-type layer and the N-type portion of the P-N or P-I-N junction.

The bonding layer may correspond to a semiconductor layer or to a stack of semiconductor layers and enables to form an ohmic contact between the intermediate layer and electrode 20. As an example, the bonding layer may be very heavily doped with the type opposite to wire 66 or to foot 80.

The stack of semiconductor layers may comprise an electron barrier layer formed of a ternary alloy, for example, aluminum gallium nitride (AlGaN) or aluminum indium nitride (AlInN) in contact with the active layer and the intermediate layer, to ensure a good distribution of electric carriers in the active layer.

Electrode 20 is capable of biasing the active layer of the light-emitting diode and of letting through the electromagnetic radiation emitted by the light-emitting diodes. The material forming electrode 20 may be a transparent and conductive material such as indium tin oxide (ITO), aluminum zinc oxide, or graphene. As an example, electrode layer 20 has a thickness in the range from 5 nm to 200 nm, preferably from 20 nm to 50 nm.

Advantageously, the shape of the emission diagram of the optoelectronic device may be controlled by modifying the radius of curvature of convex or concave portion 15, 56 having light-emitting diodes 18 formed thereon. In particular, the emission diagram may be made more or less isotropic according to the curvature of convex or concave portion 15, 56.

Figure 7:
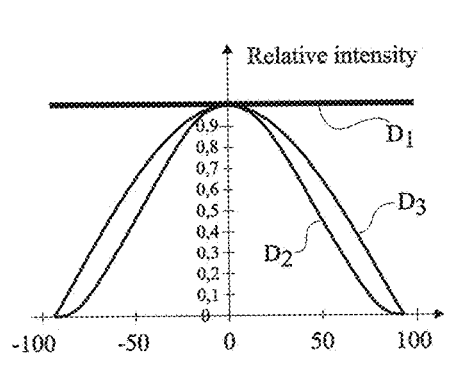
FIG. 7 shows emission diagrams of a known optoelectronic device and of the optoelectronic devices shown in FIGS. 2 and 4.

FIG. 7 shows emission diagrams D1, D2, and D3 respectively of optoelectronic device 5 shown in FIG. 2 having a convex portion 15 corresponding to a hemisphere, of optoelectronic device 55 shown in FIG. 4 having a concave portion 56 corresponding to a hemisphere, and of an optoelectronic device for which the light-emitting diodes are formed on a planar support.

Emission diagram D3 is substantially bell-shaped, which means that the maximum relative intensity is obtained along an observation direction perpendicular to the planar surface having the light-emitting diodes formed thereon and decreases when the observation direction is inclined with respect to the direction of maximum relative intensity.

According to emission diagram D1, the relative intensity is substantially the same whatever the inclination of the observation direction. A homogeneous lighting is advantageously obtained. According to emission diagram D2, the relative intensity decreases faster than for emission diagram D3 when the observation direction is inclined with respect to the direction of maximum relative intensity. A better concentration of the light beam emitted by the diode is thus obtained.

The method of manufacturing the previously-described embodiments of the optoelectronic device successively comprises forming light-emitting diodes 18 on semiconductor layer 16 while the latter is substantially planar and deforming layer 16.

The inventors have first attempted to form a light-emitting diode all over layer 16. A variation of the wavelength of the radiation emitted by the light-emitting diode has however been observed when layer 16 is being deformed, such a variation depending on the curvature applied to the active layers of the light-emitting diode.

Figure 8:
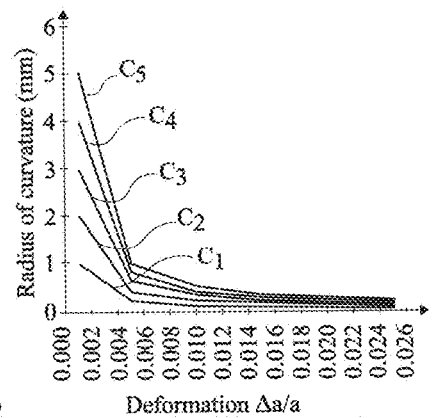
FIG. 8 shows curves of the variation of the radius of curvature of a layer according to the maximum relative deformation of the layer for a plurality of layer thicknesses.

FIG. 8 shows curves C1 to C5 of variation of the radius of curvature according to the maximum relative deformation of the layer for respective 2-µm, 4-µm, 6-µm, 8-µm, and 10-µm layer thicknesses.

The inventors have shown that a variation of the wavelength smaller than 2 nm is obtained when the maximum relative deformation of the active region of the light-emitting diode is smaller than 0.2%. For a total 6-µm diode thickness (seed layer 60, wires 66, and shell 78 for the diode shown in FIG. 5 and areas 80 and 82 for the diode shown in FIG. 8), this corresponds to a minimum 2.5-mm radius of curvature.

Figure 9:
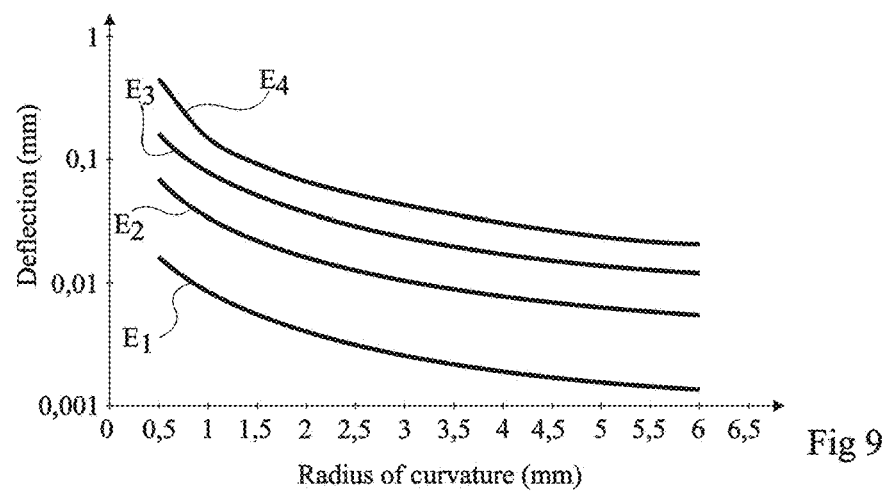
FIG. 9 shows curves of the variation of the deflection of a layer according to the radius of curvature of the layer for a plurality of layer thicknesses.

FIG. 9 shows curves E1 to E4 of variation of the deflection, in logarithmic scale, of a layer according to the radius of curvature for respective 250-µm, 500-µm, 750-µm, and 1-mm chords in a transverse cross-section plane. For a light-emitting diode having an arc length of 1.007 mm, a minimum radius of curvature of 2.5 mm corresponds to a maximum 50-µm deflection. This maximum deflection is small so that it is not possible to significantly modify the emission diagram of the optoelectronic device with respect to a planar structure.

The inventors have shown that a layer 16 having a deflection amplitude greater than 100 µm can be obtained by forming a plurality of distinct light-emitting diodes on layer 16. Indeed, the deflection amplitude of the active region of each elementary diode is then smaller than the deflection amplitude of layer 16. This enables both to control the emission diagram obtained by the curvature of layer 16 and to keep the variation of the wavelength of the emitted radiation at less than 2 nm with respect to a planar structure.

Figure 10A:
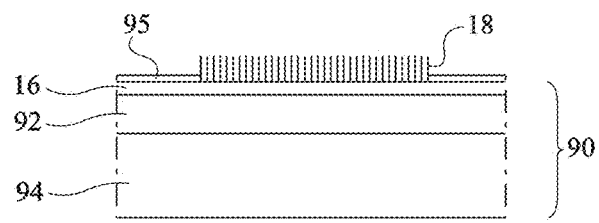
FIG. 10A to 10F are partial simplified cross-section views of the structures obtained at successive steps of another embodiment of a method of manufacturing the optoelectronic device shown in FIG. 2.
Figure 10B:
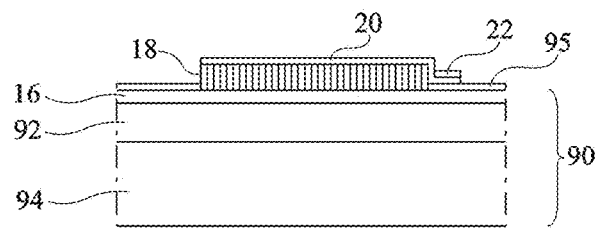
Figure 10C:
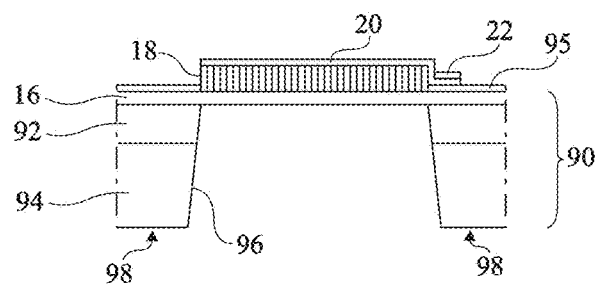

FIG. 10A to 10F illustrate an embodiment of a method of manufacturing optoelectronic device 5. This embodiment comprises the steps of:

(1) Forming light-emitting diodes 18 on a substrate 90 (FIG. 10A). In the present embodiment, substrate 90 comprises layer 16 which covers a layer 92 of an insulating material, for example, silicon dioxide, itself covering a wafer 94 of a semiconductor material, for example, silicon. The thickness of dielectric layer 92 may be in the range from 50 nm to 10 µm. The thickness of wafer 94 may be in the range from 525 µm to 2 mm. A plurality of optoelectronic devices may be formed on substrate 90. Light-emitting diodes 18 are then gathered in groups of diodes for each optoelectronic device. An insulating layer 95 covers layer 16 around light-emitting diodes 18.

In the case where light-emitting diodes 18 have the structure shown in FIG. 5, they may be formed by growing wires 66 and then forming shells 72 which cover the lateral sides and the top of wires 66. In the case where light-emitting diodes 18 have the structure shown in FIG. 6, they may be formed by forming, all over layer 16, a stack of layers having the same structure as the desired light-emitting diode, by etching this stack, for example, by plasma etching, chemical etching, or by laser cut, to delimit each light-emitting diode 18 and by filling the spaces between the light-emitting diodes with insulating portions 84.

(2) Forming, for each optoelectronic device, electrode 20 and conductive pad 22 (FIG. 10B), for example, by conformal deposition.

(3) Etching, for each optoelectronic device, an opening 96 in wafer 94 and in dielectric layer 92 to expose a portion of layer 16 (FIG. 10C) substantially opposite to the group of light-emitting diodes 18 of the optoelectronic device. Opening 96 is delimited by portions 98 of dielectric layer 92 and of wafer 94. The forming of opening 96 may comprise first and second steps. The first step comprises etching wafer 94, dielectric layer 92 being then capable of playing the role of an etch stop layer on etching of wafer 94. The second step comprises etching dielectric layer 92, semiconductor layer 16 being then capable of playing the role of an etch stop layer during the etching of dielectric layer 92. In bottom view, opening 96 may occupy a surface area in the order of 1 mm2. The distance between the lateral sides of two adjacent openings 96 may be in the order of 50 μm.

Figure 10D:
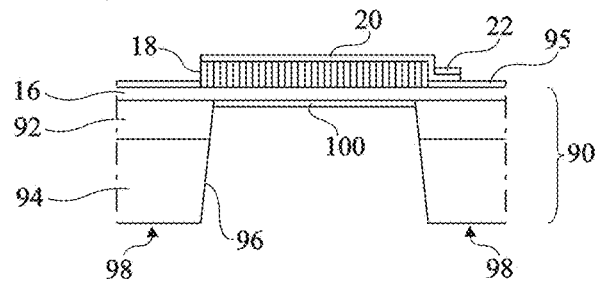

(4) Forming, for each optoelectronic device, a conductive region 100 on the surface of layer 16 exposed by opening 96 (FIG. 10D). As an example, conductive region 100 is a metal region. Conductive region 100 may comprise a stack of layers. As an example, conductive region 100 may comprise a layer of a silicide in contact with layer 16, for example, nickel silicide (SiNi) or titanium silicide ($TiSi_2$), and a metal layer.

Figure 10E:
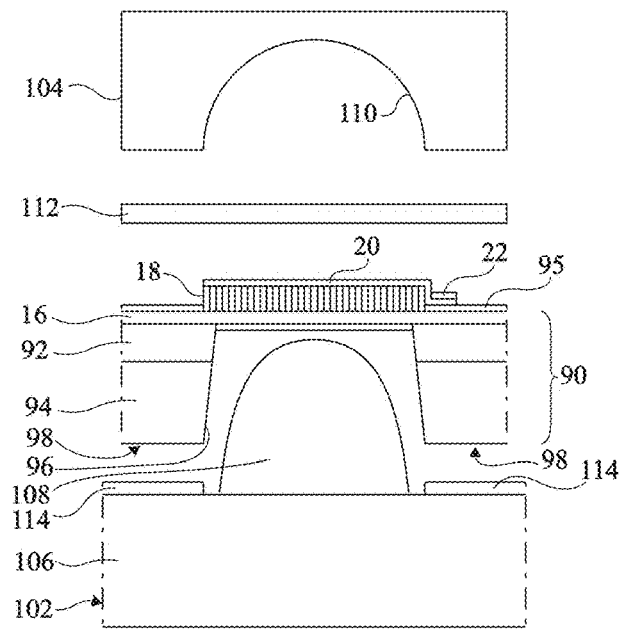

(5) Deforming layer 16 to obtain convex portion 15 (FIG. 10E). FIG. 10E is an exploded view of the system for shaping layer 16. According to an embodiment, an interposer 102 and a counter-mold 104 are used. Interposer 102 may comprise a plate 106 having a block 108 of a deformable material formed thereon for each optoelectronic device. Preferably, block 108 and plate 106 are each made of an electrically-conductive material. As an example, each block 108 is made of a solder material. Counter-mold 104 comprises, for each optoelectronic device, a cavity 110 having a shape complementary to the desired external surface of the optoelectronic device.

The deformation of layer 16 is obtained by the sandwiching of substrate 90 between interposer 102 and counter-mold 104, the block of deformable material filling opening 96. A film 112 of an elastomer may be interposed between counter-mold 104 and the light-emitting diodes during the assembly step to increase the homogeneity of the stress applied to light-emitting diodes 18. A conductive glue layer 114 may be provided between interposer 106 and substrate 90.

The volume of block 108 is determined so that, when substrate 90 is pressed against plate 102, opening 96 is totally filled with the material forming block 108 and layer 16 is deformed according to the shape of cavity 110. Preferably, the assembly operation is performed at a temperature lower than the melting temperature of the material forming blocks 108 and at a temperature higher than two thirds of the melting temperature of the material forming blocks 108 expressed in Kelvins. As an example, when blocks 108 are made of a tin, silver, and copper alloy of SAC305 type, the assembly temperature may be greater than 55° C.

Before and after the deformation, the chord of the deformed portion is constant since the ends of this portion are blocked during the deformation.

According to another embodiment, counter-mold 110 bears against substrate 10 only at locations where light-emitting diodes 18 are not present. This advantageously enables not to apply a pressure on light-emitting diodes 18.

According to another embodiment, interposer 102 may correspond to a monoblock structure and be formed by machining or by punching.

Figure 10F:
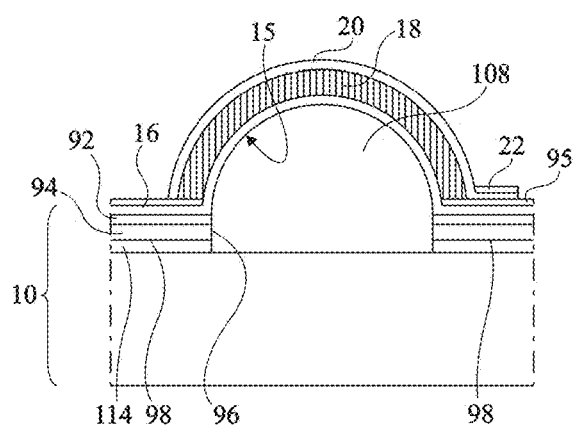

(6) Cutting interposer 102 and substrate 90 to separate optoelectronic devices 5 (FIG. 10F). Support 10 shown in FIGS. 2 and 3 corresponds to the assembly comprising the cut portion of interposer 102, the cut portion of substrate 90, and block 108.

The method comprises subsequent steps of fastening interposer 102 to base 24.

Figure 11A:
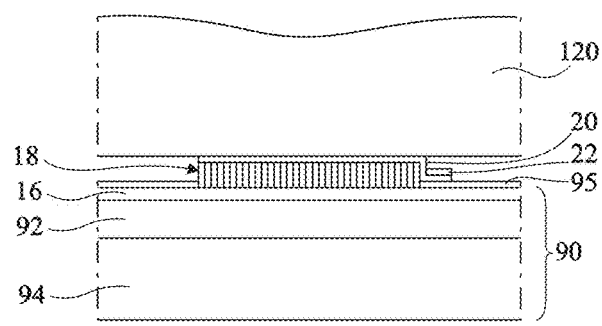
FIG. 11A to 11E are partial simplified cross-section views of structures obtained at successive steps of another embodiment of a method of manufacturing the optoelectronic device shown in FIG. 4.

FIG. 11A to 11E illustrate an embodiment of a method of manufacturing optoelectronic device 55. This embodiment comprises previously-described steps (1) and (2). It further comprises the steps of:

(3)' Fastening a handle 120 to electrode 20 (FIG. 11A).

Figure 11B:
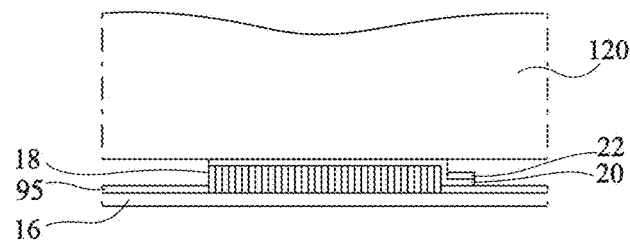

(4)' Etching plate 94 and dielectric layer 92 to expose layer 16 (FIG. 11B). Handle 120 advantageously enables to manipulate layer 16.

Figure 11C:
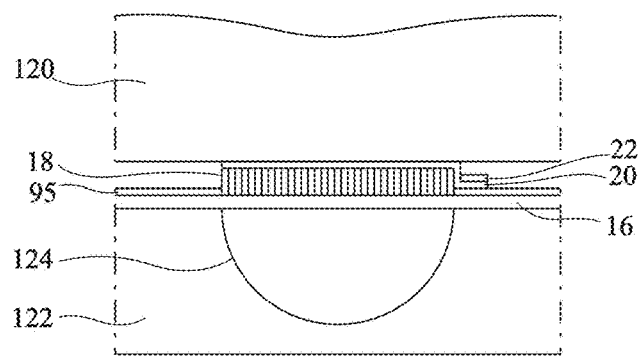

(5)' Applying layer 16 on an interposer 122 having, for each optoelectronic device, a cavity 124 having a shape complementary to the shape desired for layer 16 (FIG. 11C). A glue layer may be provided between interposer 122 and layer 16.

Figure 11D:
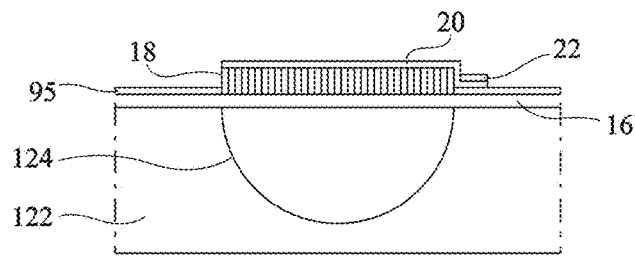

(6)' Removing handle 120 (FIG. 11D).

Figure 11E:
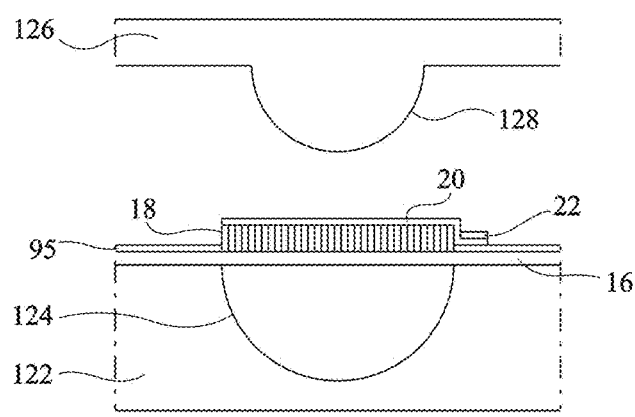

(7)' Deforming layer 16 (FIG. 11E). According to an embodiment, a counter-mold 126 is used. Counter-mold 126 comprises, for each optoelectronic device, a protrusion 128 having a shape complementary to the desired external surface of the optoelectronic device.

The deformation of layer 16 is obtained by the sandwiching of layer 16 between interposer 122 and counter-mold 126. A film, not shown, of an elastomer may be interposed between counter-mold 126 and electrode 20 during the assembly step to increase the homogeneity of the stress applied to light-emitting diodes 18.

Before and after the deformation, the chord of the deformed portion is constant since the ends of this portion are blocked during the deformation. The method continues with the cutting of optoelectronic devices 55 and the fastening of interposer 122 to base 24.

Specific embodiments of the present invention have been described. Various alterations and modifications will occur to those skilled in the art. Further, although, in the previously-described embodiments, each wire 66 comprises a passivated portion, at the base of the wire in contact with seed layer 60, passivated portion may be absent.

The invention claimed is:

1. An optoelectronic device comprising:
    a support comprising a conductive layer;
    an electrode,
    wherein the conductive layer comprises a portion having a concave or convex shape, and the electrode has a concave or convex shape, respectively; and
    at least one light-emitting diode disposed between the portion and the electrode, wherein:
        the at least one light-emitting diode comprises at least one cylindrical, conical or tapered semiconductor element in contact with a surface of the portion;
        an amplitude of a deflection of the surface between the at least one semiconductor element and the portion is smaller than or equal to 0.5 μm; and
        an amplitude of a deflection of the portion is greater than $1/20^{th}$ of a chord of the portion.

2. The optoelectronic device of claim 1, wherein a radius of curvature of the portion is greater than half the chord of the portion.

3. The optoelectronic device of claim 1, wherein a ratio of an area of the surface at which the at least one semiconductor element contact the surface to a total surface area of the portion is smaller than 0.7.

4. The optoelectronic device of claim 1, comprising at least 4 light-emitting diodes resting on the portion.

5. The optoelectronic device of claim 1, wherein the at least one light-emitting diode comprises an active region capable of emitting a light radiation, wherein the active region at least partially covers the at least one semiconductor element and is not in contact with the portion.

6. The optoelectronic device of claim 1, wherein the at least one semiconductor element is mainly made of a III-V compound.

7. The optoelectronic device of claim 6, wherein the at least one semiconductor element mainly comprises gallium nitride.

8. The optoelectronic device of claim 1, wherein the support comprises a layer of a metallic, insulating, or semiconductor material having a thickness greater than 100 nm, wherein an external surface of the layer forms the portion.

9. The optoelectronic device of claim 8, wherein the layer is made of silicon.

10. The optoelectronic device of claim 1, wherein a mean diameter of the at least one semiconductor element is between 5 nm and 2.5 µm.

11. A method of manufacturing the optoelectronic device of claim 1, comprising the steps of:
   (1) forming on a substrate light-emitting diodes, each light-emitting diode comprising a cylindrical, conical, or tapered semiconductor element, in contact with the substrate;
   (2) thinning the substrate at least at the level of the light-emitting diodes; and
   (3) deforming the substrate to form at least a concave or convex portion having light-emitting diodes resting thereon, the amplitude of the deflection of the portion being greater than $1;20^{th}$ of the chord of the portion, the amplitude of the deflection of the surface between each semiconductor element and the portion being smaller than or equal to 0.5 µm.

12. The method of claim 11, wherein, at step (3), the substrate is sandwiched between first and second parts, at least one of the first or second parts comprising a protrusion or a cavity having a shape complementary to said portion.

13. The method of claim 12, wherein said protrusion comprises a deformable material.

14. The method of claim 11, wherein step (2) comprises etching an opening into the substrate on the side opposite to the light-emitting diodes.

15. The method of claim 11, wherein step (2) comprises fastening a handle on the side of the light-emitting diodes and thinning the entire substrate.

* * * * *

UNITED STATES PATENT AND TRADEMARK OFFICE
CERTIFICATE OF CORRECTION

Page 1 of 1

PATENT NO. : 10,115,864 B2
APPLICATION NO. : 15/302478
DATED : October 30, 2018
INVENTOR(S) : Adrien Gasse et al.

It is certified that error appears in the above-identified patent and that said Letters Patent is hereby corrected as shown below:

On the Title Page

Item (73) Assignees: "Commissariat a l'Eneergie Atomique et aux Energies Alternatives, Paris (FR); Aledia, Grenoble (FR)" should be --Commissariat a l'Energie Atomique et aux Energies Alternatives, Paris (FR); Aledia, Grenoble (FR)--

Signed and Sealed this
Twelfth Day of February, 2019

Andrei Iancu
*Director of the United States Patent and Trademark Office*